United States Patent
Yu et al.

(10) Patent No.: US 10,037,962 B2
(45) Date of Patent: Jul. 31, 2018

(54) BALL HEIGHT CONTROL IN BONDING PROCESS

(71) Applicant: Taiwan Semiconductor Manufacturing Company, Ltd., Hsinchu (TW)

(72) Inventors: Tsung-Yuan Yu, Taipei (TW); Hsien-Wei Chen, Hsinchu (TW); Jie Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/584,498

(22) Filed: May 2, 2017

(65) Prior Publication Data

US 2017/0236797 A1    Aug. 17, 2017

Related U.S. Application Data

(62) Division of application No. 13/922,081, filed on Jun. 19, 2013, now Pat. No. 9,679,868.

(51) Int. Cl.
| | |
|---|---|
| *H01L 23/00* | (2006.01) |
| *H01L 23/544* | (2006.01) |
| *H01L 23/13* | (2006.01) |
| *H05K 1/11* | (2006.01) |
| *H05K 3/34* | (2006.01) |

(52) U.S. Cl.
CPC ............ *H01L 24/17* (2013.01); *H01L 23/13* (2013.01); *H01L 23/544* (2013.01); *H01L 24/81* (2013.01); *H05K 1/111* (2013.01); *H05K 3/3436* (2013.01); *H01L 2223/54426* (2013.01); *H01L 2224/04* (2013.01); *H01L 2224/05551* (2013.01); *H01L 2224/05559* (2013.01); *H01L 2224/05568* (2013.01); *H01L 2224/05572* (2013.01); *H01L 2224/11* (2013.01); *H01L 2224/1705* (2013.01); *H01L 2224/81365* (2013.01); *H05K 2201/09036* (2013.01); *H05K 2201/10674* (2013.01); *H05K 2201/10734* (2013.01)

(58) Field of Classification Search
CPC ........ H01L 24/17; H01L 24/81; H01L 23/544
See application file for complete search history.

(56) References Cited

U.S. PATENT DOCUMENTS

| | | | |
|---|---|---|---|
| 4,878,611 A | 11/1989 | LoVasco et al. | |
| 5,284,796 A | 2/1994 | Nakanishi et al. | |
| 5,633,535 A * | 5/1997 | Chao | H01L 24/75 |
| | | | 257/738 |
| 5,796,169 A | 8/1998 | Dockerty et al. | |
| 6,016,013 A | 1/2000 | Baba | |
| 6,541,305 B2 | 4/2003 | Farooq et al. | |
| 6,643,434 B2 | 11/2003 | Cayrefourcq et al. | |
| 7,989,707 B2 | 8/2011 | Yamano et al. | |

(Continued)

*Primary Examiner* — Bilkis Jahan
*Assistant Examiner* — Victor Barzykin
(74) *Attorney, Agent, or Firm* — Slater Matsil, LLP

(57) ABSTRACT

A package includes a first package component, a second package component over the first package component, and a solder region bonding the first package component to the second package component. At least one ball-height control stud separates the first package component and the second package component from each other, and defines a standoff distance between the first package component and the second package component.

20 Claims, 6 Drawing Sheets

(56) References Cited

U.S. PATENT DOCUMENTS

2003/0060035 A1\* 3/2003 Kimura ................. H01L 23/50
　　　　　　　　　　　　　　　　　　　　　　438/626
2007/0235217 A1　10/2007　Workman
2009/0127704 A1　　5/2009　Lee
2013/0134583 A1　　5/2013　Tsukiyama et al.

\* cited by examiner

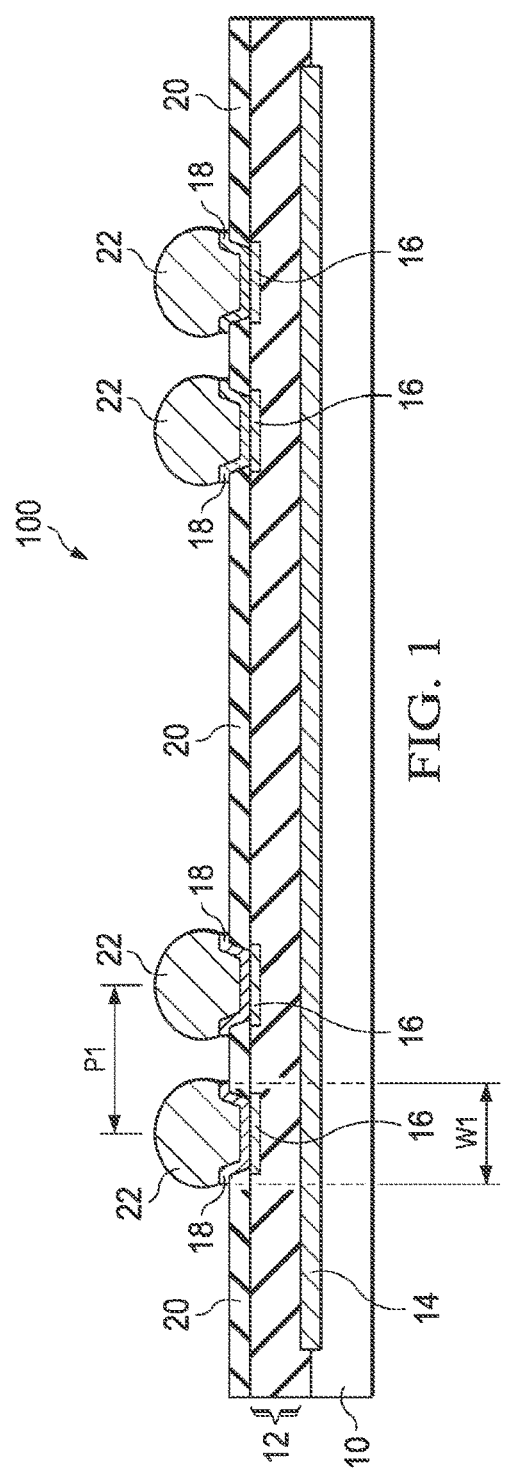
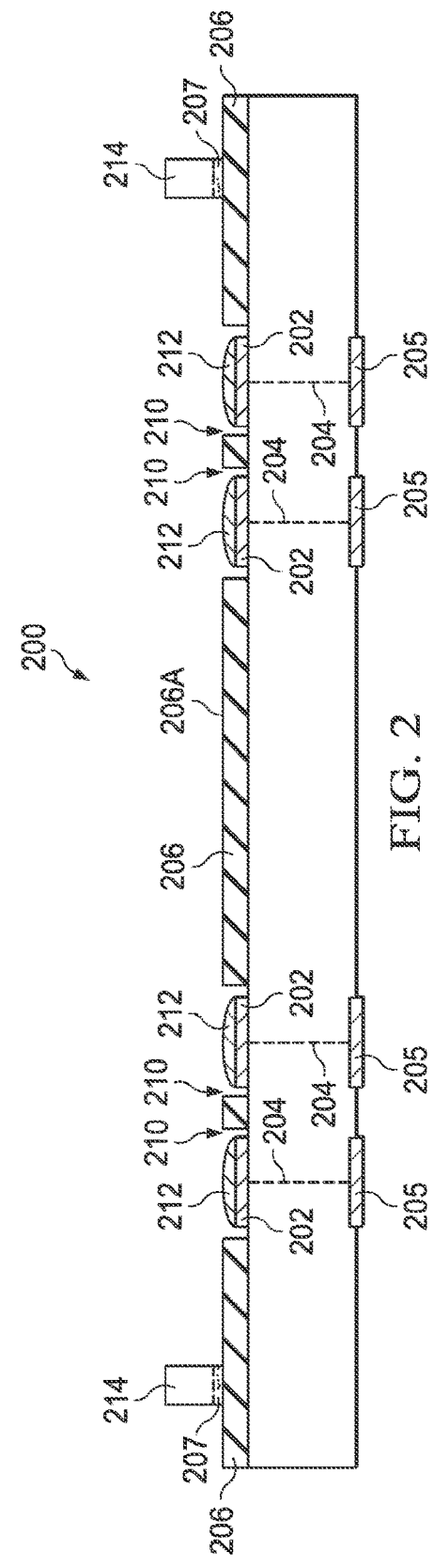

US 10,037,962 B2

BALL HEIGHT CONTROL IN BONDING PROCESS

PRIORITY CLAIM AND CROSS-REFERENCE

This application is a divisional of U.S. patent application Ser. No. 13/922,081, entitled "Ball Height Control in Bonding Process," filed on Jun. 19, 2013, which application is incorporated herein by reference.

BACKGROUND

In the packaging of integrated circuits, a device die may be bonded to another package component such as a Printed Circuit Board (PCB), a package substrate, an interposer, another device die, or the like. The bonding methods include direct metal-to-metal bonding, solder bonding, fusion bonding, hybrid bonding, and the like.

To meet the requirement of the increased integration level, more applications may be integrated into a same package. This causes the number of electrical connectors (such as solder balls) that are used for bonding to increase dramatically. The increase in the number of solder balls, however, results in other problems. For example, the device dies, the package substrates, and the PCBs could have warpage and CTE mismatch. The warpage and CTE mismatch could cause the variation in the standoff distance between the bonded package components, which results in reliability problems.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 4B are cross-sectional views of intermediate stages in the manufacturing of a package in accordance with some exemplary embodiments;

DETAILED DESCRIPTION

Figure 3:
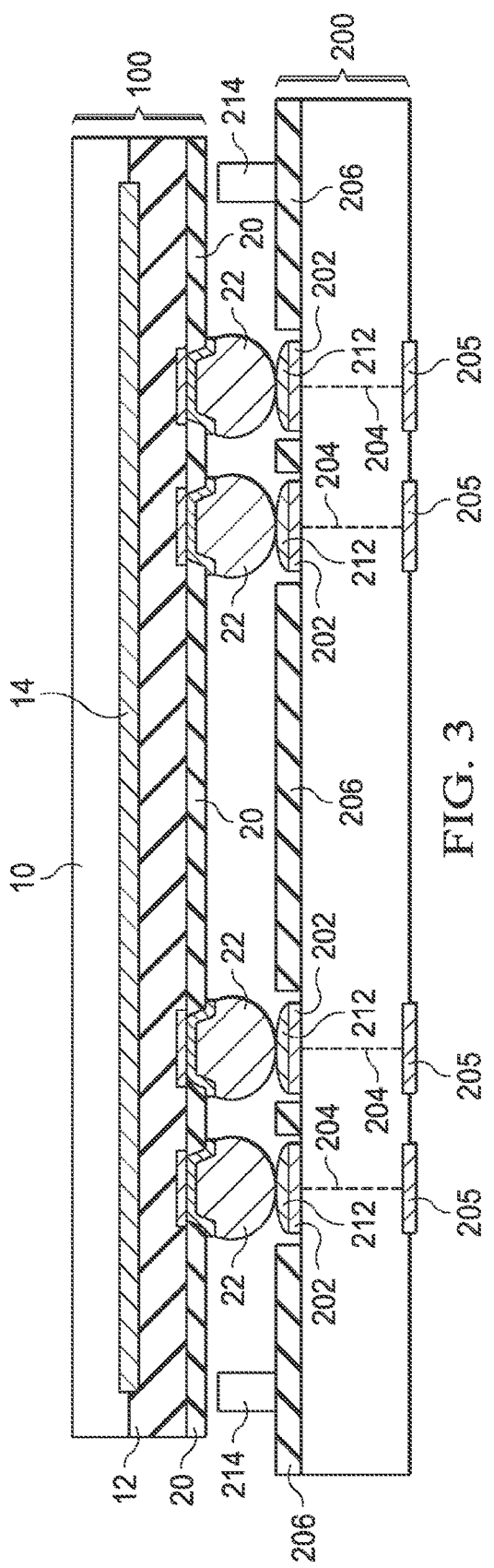

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A bonding process and the respective packages are provided in accordance with various embodiments. The intermediate stages of the bonding process are illustrated in accordance with exemplary embodiments. The variations of the embodiments are discussed. Throughout the various views and illustrative embodiments, like reference numbers are used to designate like elements.

Referring to FIG. 1, package component 100 is formed. In some embodiments, package component 100 is a device die, and hence package component 100 is alternatively referred to as die 100 throughout the description. Substrate 10 in die 100 may be a semiconductor substrate such as a silicon substrate, although it may be formed of other semiconductor materials such as silicon germanium, silicon carbon, gallium arsenide, or the like. Semiconductor devices 14, which are schematically illustrated, are formed at the top surface of substrate 10. Semiconductor devices 14 may include transistors, diodes, resistors, and/or the like. Interconnect structure 12 is further formed over substrate 10. Interconnect structure 12 may include dielectric layers (not shown), which may include an Inter-Layer Dielectric (ILD) and Inter-Metal Dielectrics (IMDs), which may include low-k dielectric materials. Interconnect structure 12 further includes metal lines and vias (not shown) formed in the dielectric layers and electrically coupled to semiconductor devices 14. The metal lines and vias may be formed of copper or copper alloys.

In alternative embodiments, die 100 comprises an interposer die, and is substantially free from active devices (such as transistors) and passive devices (such as resistors, capacitors, inductors, and/or the like). In these embodiments, substrate 10 may be formed of a semiconductor material (such as silicon) or a dielectric material. Electrical connectors may be formed on opposite sides of substrate 10, and electrically couple to each other. In alternative embodiments, die 100 is an interposer die that is free from active devices, but includes passive devices.

In some embodiments, die 100 includes metal pads 16, which are formed over interconnect structure 12. Metal pads 16 may comprise aluminum (Al), copper (Cu), silver (Ag), gold (Au), nickel (Ni), tungsten (W), alloys thereof, and/or multi-layers thereof. In some exemplary embodiments, metal pads 16 comprise aluminum copper. Metal pads 16 may be electrically coupled to semiconductor devices 14, for example, through the underlying interconnect structure 12. In some embodiments, a passivation layer(s) (not shown) is formed to cover edge portions of metal pads 16. The passivation layer may be formed of silicon oxide, silicon nitride, or multi-layers thereof.

Surface dielectric layer 20 is formed over metal pads 16, followed by a patterning step to form openings. Surface dielectric layer 20 may comprise a polymer such as polyimide, benzocyclobutene (BCB), polybenzoxazole (PBO), or the like. Under-Bump metallurgies (UBMs) 18 are formed over and electrically coupled to metal pads 16 through the openings in surface dielectric layer 20. In some embodiments, as shown in FIG. 1, UBMs 18 are formed over and in contact with metal pads 16. In alternative embodiments, a Post-Passivation Interconnect (PPI, not shown) structure is formed to electrically couple metal pads 16 to UBMs 18, wherein UBMs 18 may land on the pads of the PPI. In some exemplary embodiments, each of UBMs 18 includes a barrier layer (not shown) and a seed layer (not shown) over the barrier layer. The barrier layer may extend into the opening in surface dielectric layer 20. The Barrier layer may be a titanium layer, a titanium nitride layer, a tantalum layer, a tantalum nitride layer, or layers formed of a titanium alloy or a tantalum alloy. The materials of the seed layer may include copper or copper alloys, although other metals such as silver, gold, aluminum, palladium, nickel, nickel alloys, tungsten alloys, chromium, chromium alloys, and combinations thereof may also be used.

In some embodiments, the formation of UBMs 18 includes performing a deposition step using Physical Vapor Deposition (PVD) or other applicable methods to form a blanket UBM layer, and then etching the blanket UBM layer to form UBMs 18. In some embodiments, UBMs 18 have a horizontal dimension W1 between about ((ball pitch)/2−50 µm) and about (ball pitch)/2+50 µm), wherein the ball pitch is the pitch P1 between neighboring solder balls 22. It is appreciated, however, that the values recited throughout the description are merely examples, and may be changed to different values. Solder balls 22 are then formed on UBMs 18. The formation of solder balls 22 may include placing pre-formed solder balls 22 on UBMs 18, and then performing a reflow process to join solder balls 22 with UBMs 18. In alternative embodiments, the formation of solder balls 22 include plating solder regions on UBMs 18, and then reflowing the solder regions to form solder ball.

FIG. 2 illustrates a cross-sectional view of package component 200. In some embodiments, package component 200 includes a Printed Circuit Board (PCB). In alternative embodiments, package component 200 includes a package substrate, an interposer, a package, or the like. For example, package component 200 may be a build-up substrate, which may include a core and dielectric layers formed on opposite sides of the core. Alternatively, package component 200 is a laminate substrate. In yet alternative embodiments, package component 200 is an interposer die that is free from active devices (such as transistors) therein. Package component 200 may also include surface conductive features such as bond pads (or other types of connectors) 202 on the top surface. In some embodiments, package component 200 includes redistribution traces 204 connected to bond pads 202, wherein the redistribution traces may be disposed on the surfaces of package component 200 and/or embedded in package component 200. Redistribution traces 204 may interconnect some of bond pads 202. Bond pads 205 may also be formed on the bottom surface of package component 200, and are electrically connected to bond pads 202 through redistribution traces 204.

Package component 200 may include surface electric layer 206. In some exemplary embodiments, surface electric layer 206 comprises a solder mask material, which may comprise a polymer. Openings 210 are formed in surface electric layer 206, with bond pads 202 disposed in openings 210. Surface electric layer 206 may comprise a resin, a polymer, or other organic or inorganic materials. In some embodiments, bond pads 202 may be non-solder mask defined pads, as shown in FIG. 2, wherein openings 210 are larger than bond pads 202. In alternative embodiments, bond pads 202 are solder mask defined pads, wherein surface electric layer 206 covers the edge portions of bond pads 202, leaving the center portions of bond pads 202 exposed through openings 210. In some embodiments, solder-containing layer 212, which may be a solder layer (sometimes known as a pre-solder layer), a solder paste, or the like, is formed on each of bond pads 202.

Ball-height control studs 214 are formed over the top surface 206A of surface dielectric layer 206. Ball-height control studs 214 may comprise a material selected from resin, polymer, ceramic, metal, or the like. In some embodiments, ball-height control studs 214 and surface dielectric layer 206 are formed of different materials, and hence visible interfaces may exist between ball-height control studs 214 and surface dielectric layer 206. Ball-height control studs 214 may be adhered to surface dielectric layer 206 through adhesive 207 in some embodiments. Alternatively, ball-height control studs 214 and surface dielectric layer 206 are formed of a same material, and may be formed in a same process or in different processes. Accordingly, there may be visible interfaces or no visible interfaces between ball-height control studs 214 and surface dielectric layer 206. For example, ball-height control studs 214 and surface dielectric layer 206 may be formed in a same process such as stencil stamping. Accordingly, no interfaces exist between ball-height control studs 214 and surface dielectric layer 206.

FIG. 3 illustrates the alignment of die 100 to package component 200. Solder balls 22 are aligned to, and are put against, solder-containing layers 212, as shown in FIG. 3. Ball-height control studs 214 are located in the space between die 100 and package component 200. In some embodiments, the top surfaces of ball-height control studs 214 are spaced apart from surface dielectric layer 20.

Figure 4A:
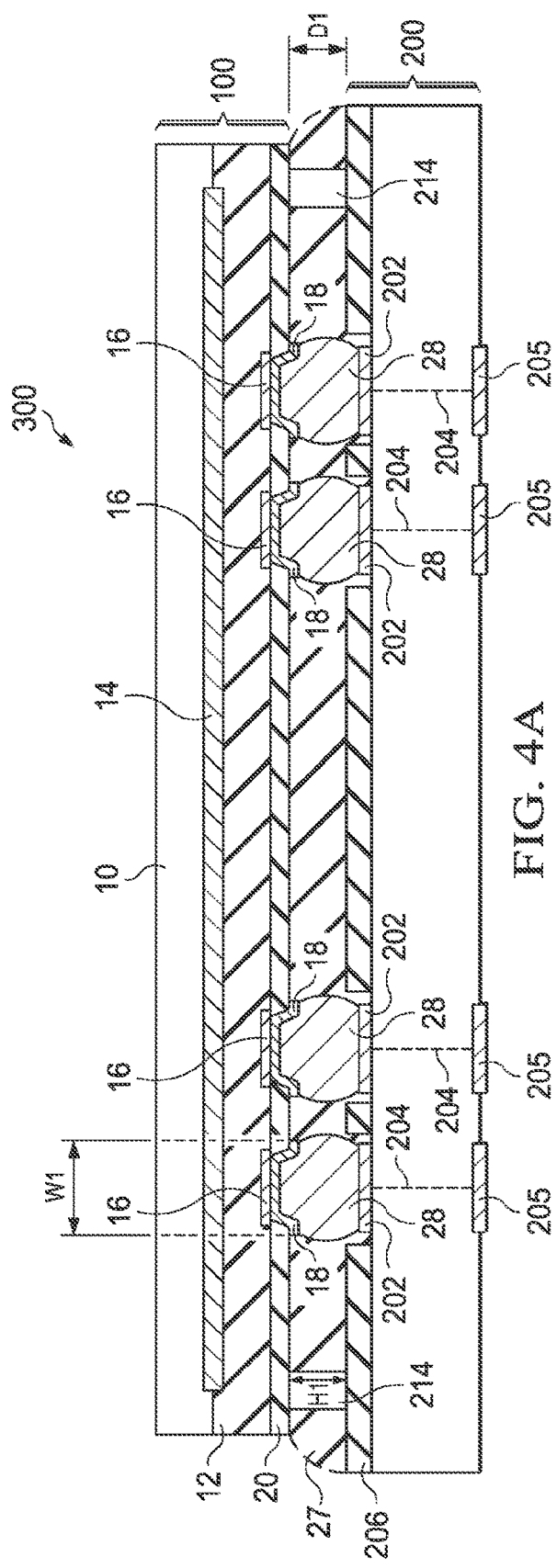

Next, as shown in FIG. 4A, a reflow process is performed, and solder balls 22 are reflowed. Die 100 and package component 200 are thus bonded together to form package 300. In the embodiments in which solder-containing layers 212 are formed on bond pads 202, solder-containing layers 212 and solder balls 22 in FIG. 3 are molten to form solder regions 28, which join UBMs 18 to bond pads 202.

In the bonding process, the molten solder regions 28 may be pressed, partially due to the weight of die 100, which causes die 100 to move downwardly. The downward movement of die 100 is stopped by ball-height control studs 214. Hence, after the bonding process, surface dielectric layer 20 of die 100 is in contact with the top surfaces of ball-height control studs 214. Accordingly, the standoff distance D1 between die 100 and package component 200 may be equal to height H1 of ball-height control studs 214. Height H1 of ball-height control studs 214 may thus be selected to control the standoff distance D1 to a desirable value. The optimum height H1 is related to the size of solder balls 22 and width W1 of UBMs 18. Height H1 may be selected to be between (W1−80 μm) and about W1. This range of height H1 is greater than the standoff distance D1 that will otherwise occur when no ball-height control stud 214 is used. Therefore, the use of ball-height control studs 214 results in the increase in the standoff distance D1.

Figure 4B:
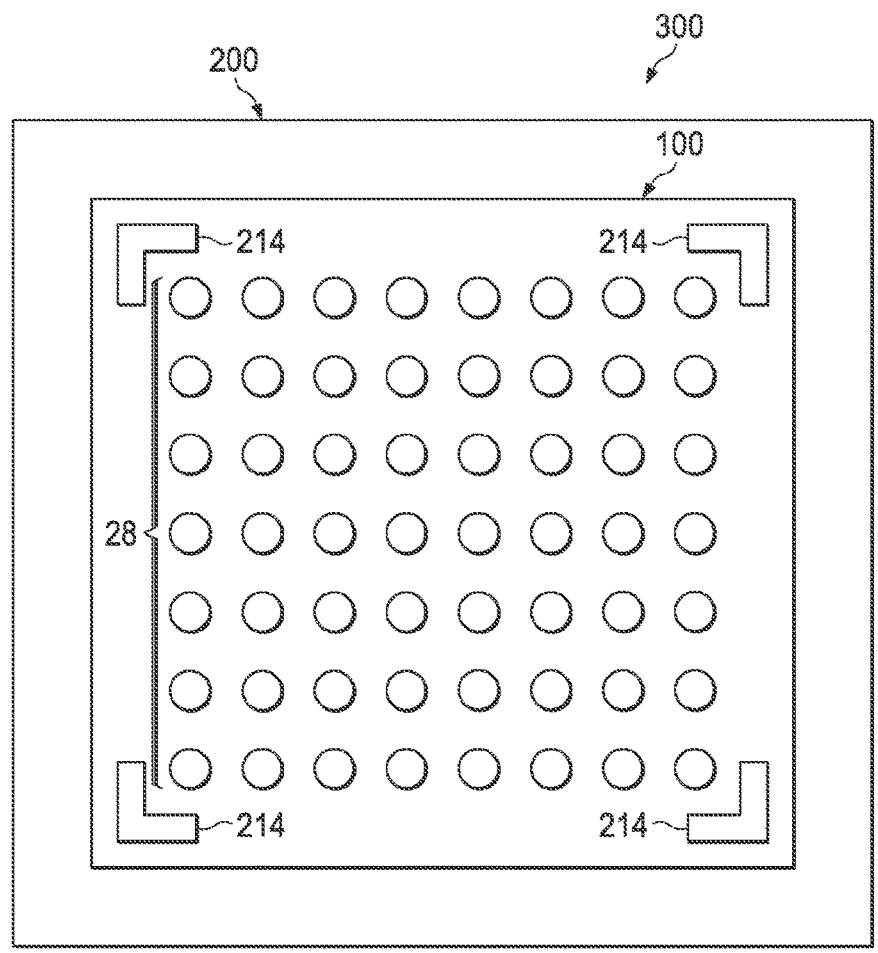

FIG. 4B illustrates a top view of package 300 shown in FIG. 4A. In some embodiments, there are four ball-height control studs 214 disposed to the corners of die 100. Ball-height control studs 214 are illustrated using dashed lines to indicate that they are underlying die 100. In alternative embodiments, the total number of ball-height control studs 214 is equal to or greater than, and may be three, five, six, or any greater positive number. The plurality of ball-height control studs 214 is spaced apart from each other, and may be disposed substantially uniformly. In some embodiments, ball-height control studs 214 are disposed adjacent to the peripheral regions of die 100. In addition, ball-height control studs 214 may also be disposed to the inner regions of die 100 surrounded by the peripheral regions. For example, a plurality of ball-height control studs 214 may be disposed uniformly through the space between die 100 and package component 200.

Referring back to FIG. 4A, in some embodiments, after the bonding step, underfill 27 is dispensed between die 100 and package component 200. Underfill 27 maybe in contact with surface dielectric layers 20 and 206, and may encircle each of the ball-height control studs 214. In alternative embodiments, underfill 27 is not disposed. Accordingly, at a time package 300 is used (when package 300 is powered up), no underfill exists between die 100 and package component 200. Furthermore, in some embodiments, ball-height control studs 214 are not removed after the bonding process. Accordingly, at a time package 300 is used (when package 300 is powered up), ball-height control studs 214 remain in package 300. In alternative embodiments, ball-height control studs 214 are removed after the bonding process.

Figure 5A:
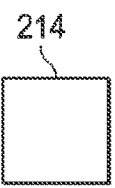
FIGS. 5A through 5D illustrate top views of some exemplary ball-height control studs.
Figure 5B:
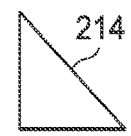
Figure 5C:
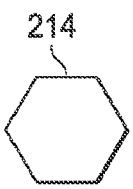
Figure 5D:

FIGS. 5A through 5D illustrate some exemplary top-view shapes of ball-height control studs 214. In FIG. 5A, ball-height control stud 214 has a rectangular top-view shape, which may also be squares in some embodiments. In FIG. 5B, ball-height control stud 214 has a triangular top-view shape. In FIG. 5C, ball-height control stud 214 has a hexagon top-view shape. In FIG. 5D, ball-height control stud 214 has a round top-view shape. Ball-height control stud 214 may also have any other top-view shapes, which are also in the scope of the present disclosure.

Figure 6:
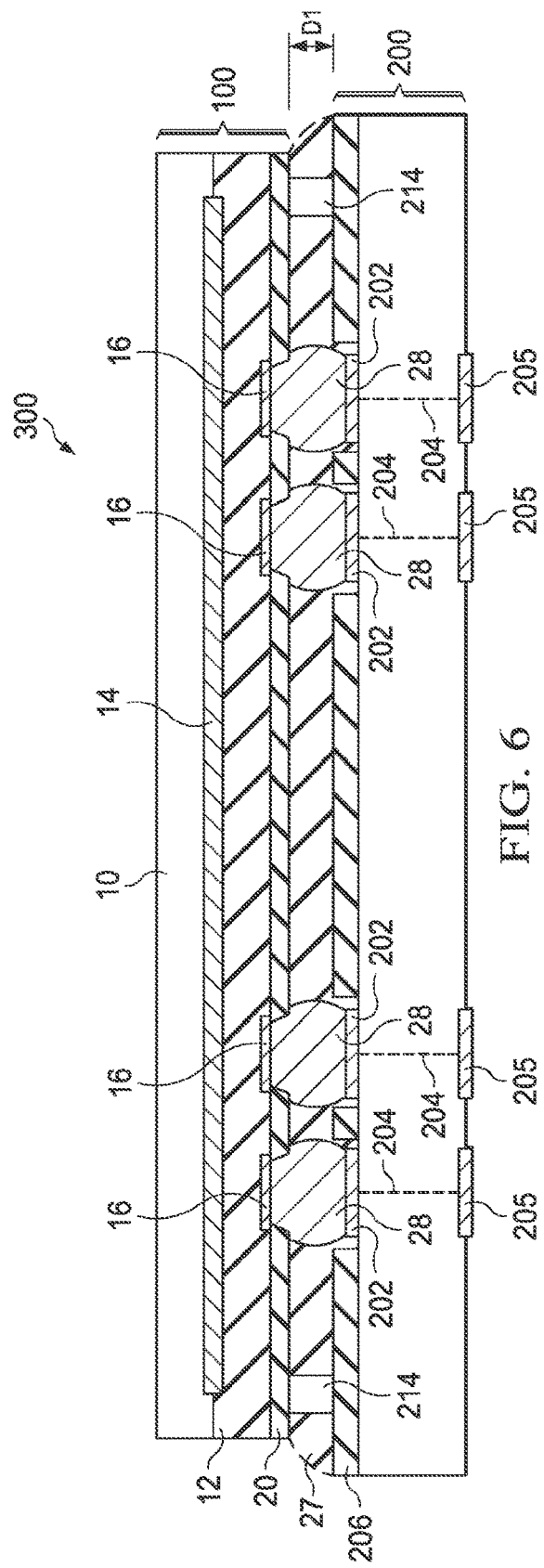
FIGS. 6 and 7 illustrate packages in accordance with alternative embodiments.
Figure 7:
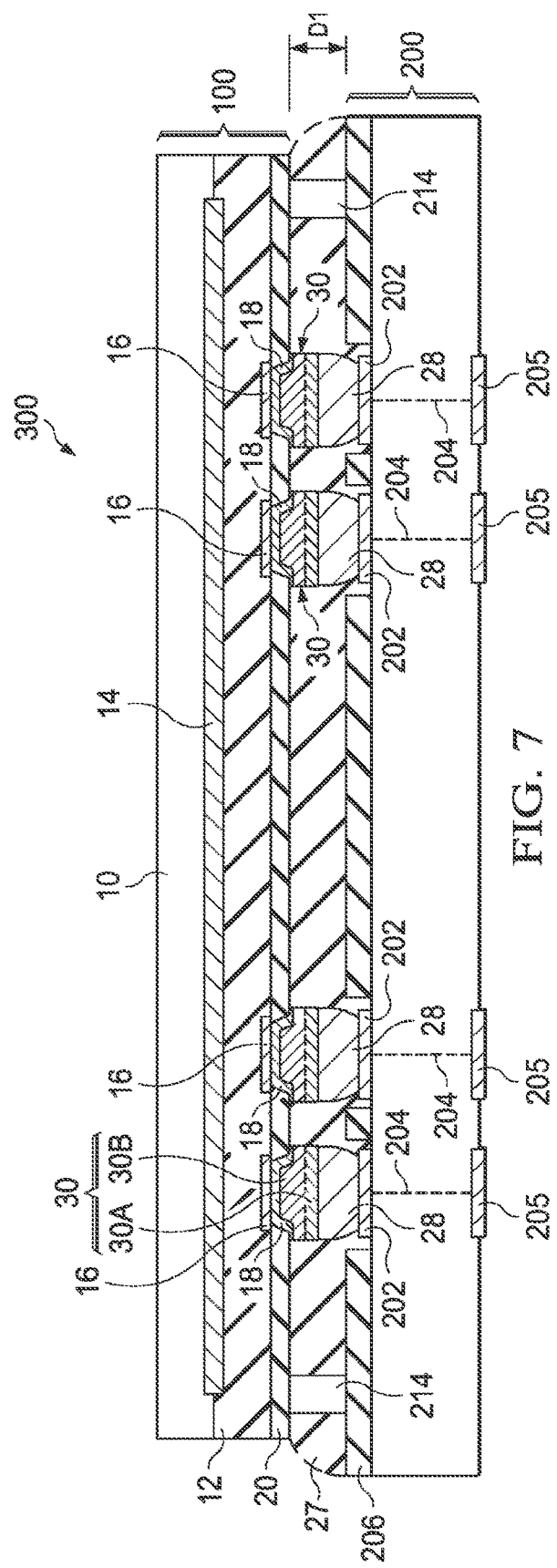

FIGS. 6 and 7 illustrate packages 300 in accordance with alternative embodiments. FIG. 6 illustrates a package similar to the package in FIG. 5A, except that no UBMs are formed, and solder regions extend into the openings in surface dielectric layer 20 to contact metal pads 16. In these embodiments, metal pads 16 act as the surface conductive features of die 100. Similarly, ball-height control studs 214 are used to control the standoff distance D1 between die 100 and package component 200.

FIG. 7 illustrates a package similar to the package in FIG. 5A, except that metal pillars 30 are formed between UBMs 18 and solder regions 28. In some embodiments, metal pillars 30 are formed through plating. In these embodiments, metal pillars 30 are referred to as the surface conductive features of die 100. Each of metal pillars 30 may include at least a first portion 30B comprising copper, a copper alloy, or the like. In some embodiments, each of metal pillars 30 further includes second portion 30A, wherein metal layer portion 30A may comprise nickel, palladium, and the like. In yet alternative embodiments, metal layer portion 30A is not formed, and the entirety of each of metal pillars 30 may be copper-containing pillars. Similarly, ball-height control studs 214 are used to control the standoff distance D1 between die 100 and package component 200.

Simulations were performed to study the relationship between standoff distance D1 and the reliability of the resulting packages. Three groups of sample packages, which have the structures similar to what is shown in FIG. 4A, were made. The three groups of sample packages differ from each other only in the standoff distances. The first, the second, and the third groups of sample packages have standoff distances equal to 135 μm, 310 μm, and 420 μm, respectively. Thermal cycles were performed on each of the three groups of sample packages to study the reliability of the three sample groups. In each cycle, the temperature of the respective package was increased to 125° C., and reduces back to −40° C. A t0.1 value is defined to represent how many thermal cycles need to be performed until one percent of the sample packages in the respective group of samples fail. Therefore, a higher t0.1 value indicates that the respective samples are more reliable, and are less prone to the fail caused by thermal cycles. Simulation results reveal that the t0.1 values of the first, the second, and the third groups of sample packages were 131, 327, and 777, respectively. This means that if the standoff distance is 135 μm, after 131 thermal cycles, one percent of the samples will fail. As a comparison, if the standoff distance is increased to 420 μm, after 777 thermal cycles, one percent of the samples will fail. Accordingly, by increasing the standoff distance between die 100 and package component 200, the reliability of the resulting package is improved.

The above-discussed thermal cycles are performed when no underfill is used in the sample packages. When the underfill (refer to underfill 27 in FIG. 4A) is used to form a fourth group of sample packages, the t0.1 value correspond to the standoff distance of 135 μm is 786. This indicates that the reliability of the third and the fourth groups of sample packages are comparable to each other. However, the third group of sample package achieves such reliability without the using of underfill. This means that by increasing the standoff distance by using the ball-height control studs, the reliability may be as good as when underfill is used, while the manufacturing cost for disposing the underfill may be saved.

In accordance with some embodiments, a package includes a first package component, a second package component over the first package component, and a solder region bonding the first package component to the second package component. At least one ball-height control stud separates the first package component and the second package component from each other, and defines a standoff distance between the first package component and the second package component.

In accordance with other embodiments, a package includes a first package component and a second package component. The first package component includes a first surface dielectric layer at a top surface of the first package component, and a bond pad exposed through an opening in the first surface dielectric layer. The second package component includes a second surface dielectric layer at a surface of the second package component, and a surface conductive feature adjacent to the surface of the second package component. A solder region is located between and in contact with the bond pad and the surface conductive feature. A plurality of ball-height control studs is between the surface dielectric layer and the second surface dielectric layer, wherein the plurality of ball-height control studs contacts the second surface dielectric layer.

In accordance with yet other embodiments, a method includes aligning a first package component to a second package component, wherein a solder region in the first package component is aligned to, and is in contact with, a surface conductive feature in the second package component. The solder region is then reflowed to bond the first package component to the second package component. During the reflow, a ball-height control stud between the first package component and the second package component is in contact with the first package component and the second package component to define a standoff distance between the first package component and the second package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a ball-height control stud and a surface dielectric layer as parts of a first package component, wherein the ball-height control stud and the surface dielectric layer are formed in a common process and are formed of a same dielectric material, and wherein no distinguishable interface is between the ball-height control stud and the surface dielectric layer;
aligning a second package component to the first package component, wherein a solder region in the second package component is aligned to, and is in contact with, a surface conductive feature in the first package component; and
reflowing the solder region to bond the first package component to the second package component, wherein during the reflow, the ball-height control stud is located between, and is in contact with, the first package component and the second package component to define a standoff distance between the first package component and the second package component.

2. The method of claim 1, wherein the ball-height control stud forms a step with a top surface and an edge of the surface dielectric layer.

3. The method of claim 1, wherein the common process comprises stencil stamping.

4. The method of claim 1, wherein the ball-height control stud is pre-formed as an integrated part of the second package component before the aligning.

5. The method of claim 1, wherein the second package component comprises a device die, and the first package component comprises a package substrate.

6. The method of claim 1, wherein during the reflowing, a plurality of ball-height control studs between the first package component and the second package component in combination defines the standoff distance.

7. The method of claim 1 further comprising, after the reflowing, disposing an underfill into a space between the first package component and the second package component, wherein the underfill encircles the ball-height control stud.

8. The method of claim 1, wherein the same dielectric material comprises a polymer.

9. A method comprising:
forming a first package component comprising:
    a first surface dielectric layer; and
    a bond pad in the first surface dielectric layer, wherein a top surface of the bond pad is lower than a top surface of the first surface dielectric layer;
forming a second package component comprising:
    a second surface dielectric layer at a surface of the second package component; and
    an Under-Bump Metallurgy (UBM) comprising a portion in the second surface dielectric layer;
forming a ball-height control stud over and contacting the first surface dielectric layer, wherein the ball-height control stud and the first surface dielectric layer are formed of a same dielectric material through a common process, with no distinguishable interface existing between the ball-height control stud and the first surface dielectric layer, and the ball-height control stud forms a step with a top surface and an edge of the first surface dielectric layer; and
bonding the second package component to the first package component, wherein a solder region bonds the bond pad to the UBM.

10. The method of claim 9, wherein the ball-height control stud is formed of a resin.

11. The method of claim 9, wherein after the bonding, the ball-height control stud is in contact with the second surface dielectric layer.

12. The method of claim 9, wherein the second package component comprises a device die.

13. The method of claim 9 further comprising forming a plurality of ball-height control studs over and contacting the first surface dielectric layer, wherein the plurality of ball-height control studs is distributed substantially uniformly along a peripheral of the first package component.

14. The method of claim 13, wherein the plurality of ball-height control studs and the ball-height control stud in combination comprise four discrete ball-height control studs physically separated from each other, with each of the four discrete ball-height control studs being adjacent to a corner region of the first package component.

15. The method of claim 9 further comprising dispensing an underfill into a space between the first package component and the second package component, wherein the underfill encircles, and is in physical contact with, the ball-height control stud.

16. The method of claim 9, wherein the ball-height control stud and the first surface dielectric layer are formed through stencil stamping of a polymer.

17. The method of claim 9, wherein the bonding the first package component to the second package component comprises reflowing solder region.

18. A method comprising:
forming a package substrate comprising:
    forming a top dielectric layer; and
    forming a ball-height control stud, wherein the top dielectric layer and the ball-height control stud are formed in a same process and using a same dielectric material, and no distinguishable interface is between the ball-height control stud and the top dielectric layer;
bonding a device die to the package substrate, wherein the ball-height control stud is located between the device die and the package substrate, and the ball-height control stud has a top surface in contact with, and not adhered to, a bottom surface of the device die, wherein the ball-height control stud forms a step with a top surface and an edge of the top dielectric layer; and
dispensing an underfill to fill a gap between the package substrate and the device die.

19. The method of claim 18, wherein the ball-height control stud and the top dielectric layer are formed using stencil stamping.

20. The method of claim 18, wherein the ball-height control stud and the top dielectric layer are formed of a polymer.

* * * * *